United States Patent
Ha et al.

(10) Patent No.: US 10,527,659 B2
(45) Date of Patent: Jan. 7, 2020

(54) APPARATUS FOR DETERMINATION OF THE FREQUENCY OF AN ELECTRICAL SIGNAL AND ASSOCIATED METHODS

(71) Applicant: General Electric Technology GmbH, Baden (CH)

(72) Inventors: Hengxu Ha, Stafford (GB); Sankara Subramanian Sri Gopala Krishna Murthi, Stafford (GB); Xianwu Zeng, Stafford (GB)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 15/410,802

(22) Filed: Jan. 20, 2017

(65) Prior Publication Data

US 2017/0219640 A1    Aug. 3, 2017

(30) Foreign Application Priority Data

Jan. 28, 2016 (EP) .................................... 16275014

(51) Int. Cl.
 *G01R 23/02* (2006.01)
(52) U.S. Cl.
 CPC .................... *G01R 23/02* (2013.01)
(58) Field of Classification Search
 CPC .................................................... G01R 23/02
 See application file for complete search history.

(56) References Cited

U.S. PATENT DOCUMENTS

| | | | |
|---|---|---|---|
| 5,721,689 A | 2/1998 | Hart et al. | |
| 6,014,617 A * | 1/2000 | Kawahara | G10L 25/90 |
| | | | 704/205 |
| 6,687,309 B1 | 2/2004 | Zhang et al. | |
| 8,265,940 B2 * | 9/2012 | Geiser | G10L 21/038 |
| | | | 704/201 |
| 2003/0162500 A1 | 8/2003 | Wu et al. | |
| 2004/0136474 A1 | 7/2004 | Hwang | |

FOREIGN PATENT DOCUMENTS

JP        2013-53861 A     3/2013

OTHER PUBLICATIONS

Extended European Search and Opinion issued in connection with corresponding EP Application No. 16275014.5 dated Aug. 29, 2016.

* cited by examiner

*Primary Examiner* — Mohamed Charioui
(74) *Attorney, Agent, or Firm* — Eversheds Sutherland (US) LLP

(57) ABSTRACT

An apparatus for determining a measure of the frequency of an electrical signal is provided. The apparatus is configured to, based on a plurality of samples of the electrical signal, determine a Hilbert transformation to obtain a value for each of the samples of the electrical signal for use as an imaginary representation of each of the samples of the electrical signal and combine each said imaginary representation with a corresponding real representation of the samples of the electrical signal to form a complex representation of the electrical signal; perform a Fourier transform on each said complex representation of the samples of the electrical signal and determine a phase angle therefrom; and determine a measure of the frequency of the electrical signal based on a derivative of the phase angle with respect to time.

14 Claims, 1 Drawing Sheet

APPARATUS FOR DETERMINATION OF THE FREQUENCY OF AN ELECTRICAL SIGNAL AND ASSOCIATED METHODS

BACKGROUND

Embodiments of the present invention relate to an apparatus configured to determine a measure of the frequency of an electrical signal. Embodiments of the present invention also relate to a power network and an associated method.

The accurate determination of the frequency of an electrical signal is important for monitoring and/or controlling electrical systems or power networks, such as power distribution networks.

BRIEF DESCRIPTION

According to a first aspect of the invention, an apparatus is provided for determining a measure of the frequency of an electrical signal, and the apparatus is configured to, based on a plurality of samples of the electrical signal, determine a Hilbert transformation to obtain a value for each of the samples of the electrical signal for use as an imaginary representation of each of the samples of the electrical signal and combine each said imaginary representation with a corresponding real representation of the samples of the electrical signal to form a complex representation of the electrical signal; perform a Fourier transform on each said complex representation of the samples of the electrical signal and determine a phase angle therefrom; and determine a measure of the frequency of the electrical signal based on a derivative of the phase angle with respect to time.

The apparatus may be beneficial as the use of a Hilbert transformation in the formation of the complex representation provides for robust determination of the frequency from the derivative of the phase angle. Applying the Fourier transform to the complex representation may be advantageous.

In one or more examples, the apparatus comprises a controller for an electrical system and the controller is configured to provide said measure of the frequency of the electrical signal for control of the electrical system. The electrical system may comprise a power convertor, a power generation system, a power transmission system or a power distribution system.

In one or more examples, determination of the measure of the frequency is based on an average of the derivative of the phase angle with respect to time.

In one or more examples, said average is taken over a time window related to a rated frequency of the electrical signal. Thus, the electrical signal may be rated at a particular frequency and the apparatus may be configured to determine a deviation from the rated frequency.

In one or more examples, the apparatus is configured to time delay the real representation of the measurement of the electrical signal to temporally align it with the imaginary representation when forming the complex representation of the electrical signal, said time delay based on an order of Hilbert coefficients used in the determination of the Hilbert transformation. Typically, the order of Hilbert coefficients is related to the number of coefficients used in the Hilbert transformation.

In one or more examples, the time delay, in terms of the number of samples, comprises N where N comprises the order of the Hilbert coefficients used in the Hilbert transformation. In one or more examples, the order may be up to 1, 2, 3, 4, 5, 6 or more.

In one or more examples, the Hilbert transformation is performed using three Hilbert coefficients. These coefficients may be obtained when the order is equal to one.

In one or more examples, the apparatus is configured to provide a feedback signal based on the determined measure of the frequency and wherein a magnitude of said imaginary representation of the samples of the electrical signal is modified by said feedback signal prior to said Fourier transformation. This may be advantageous because the feedback of frequency is before the Fourier transformation which removes noise as a band pass filter.

In one or more examples, the determination of the Hilbert transformation to determine the imaginary representation $y(n)$ of the electrical signal $x(n)$, where n is one of the samples of the electrical signal comprises convolution of the electrical signal $x(n)$ with Hilbert coefficients in accordance with the following formula:

$$y(n) = x * H(n) = \sum_{k=0}^{2N} x(n-k)H(k)$$

in which symbol "*" represents a convolution operation; and $H(k)$ represents Hilbert coefficients as follows:

$$H(k) = \frac{2}{\pi}\left\{-\frac{1}{N}, \ldots, 0, -\frac{1}{2}, 0, -1, 0, 1, 0, \frac{1}{2}, 0, \frac{1}{3}, 0, \ldots, \frac{1}{N}\right\}$$

where N represents an order of the Hilbert coefficients.

In one or more examples, the Hilbert transformation is performed using the Hilbert coefficients where the order $N=1$, such that:

$$H(k) = \frac{2}{\pi}\{-1, 0, 1\}$$

In one or more examples, the performance of the Fourier transform on the complex representation $x_c$ to form a frequency domain phasor $X_{Phs}(n)$ comprises:

$$X_{Phs}(n) = \frac{2}{N_{spc}} \sum_{k=0}^{N_{spc}-1} x_c(n-k) \exp\left(j\frac{2\pi k}{N_{spc}}\right)$$

in which $N_{spc}$ comprises the number of samples per cycle of rated fundamental frequency of the electrical signal and k is an index value.

For example, if the sampling frequency $f_s=2000$ Hz, the rated fundamental frequency is $f_0=50$ Hz, then $N_{spc}=f_s/f_0=2000/50=40$ samples/cycle.

In one or more examples, the following equation is calculated to determine the phase angle $\varphi(n)$ from the phasor $X_{Phs}(n)$ output from the Fourier transformation:

$$\varphi(n) = \arctan\left(\frac{\mathrm{Im}(X_{Phs}(n))}{\mathrm{Re}(X_{Phs}(n))}\right)$$

In one or more examples, the measure of frequency comprises an instantaneous measure of frequency $f_{cal}(n)$ and is determined by the following equation:

$$f_{cal}(n) = \frac{\varphi(n) - \varphi(n-1)}{2\pi T_s}$$

in which n is the sample number of the plurality of samples and $T_s$ is the sampling period. It will be appreciated that the sampling period is the reciprocal of the sampling frequency used to obtain the samples of the electrical signal. Thus, if the sampling frequency fs=2000 Hz, Ts=1/fs=1/2000=0.0005 (seconds).

In one or more examples, the measure of frequency comprises an average measure of frequency f(n) and is determined by the following average filter formula:

$$f(n) = \frac{1}{N_{spc}} \sum_{k=0}^{N_{spc}-1} f_{cal}(n-k)$$

in which the window length Nspc of the average filter comprises the number of samples per cycle of rated fundamental frequency of the electrical signal, n is the sample number and k is an index value and:

$$f_{cal}(n) = \frac{\varphi(n) - \varphi(n-1)}{2\pi T_s}$$

in which n is the sample number of the plurality of samples and $T_s$ is sampling period.

In one or more examples, the feedback signal $K_{comp}$ is based on a curve fitting method to an amplitude-frequency response of the Hilbert coefficients used in the Hilbert transformation.

In one or more examples, the feedback signal $K_{comp}$ is determined by the following formula:

$$K_{comp} = a_1 \frac{f}{f_0} + a_2 \left(\frac{f}{f_0}\right)^3 + \ldots + a_m \left(\frac{f}{f_0}\right)^{2m-1}$$

in which $a_1, a_2, \ldots, a_m$ are coefficients calculated by curve fitting to an amplitude-frequency response of the Hilbert coefficients used in the Hilbert transformation and $f_0$ is the rated frequency of the electrical signal. In one or more examples, the coefficients are obtained by the following steps:

The amplitudes of Hilbert coefficients with respect to a discrete frequency range are calculated from a predetermined lower-expected-frequency-limit $f_{left}=1$ to a predetermined higher-expected-frequency-limit $f_{heft}=100$, and using a predetermined frequency step $\Delta f=1$ in accordance with the following equation:

$$H_F(n) = \left| \sum_{k=0}^{4N-2} H(k) e^{j2\pi k \Delta fn} \right|$$

in which $k=f_{left}=1, f_{left}+\Delta f, f_{left}+2\Delta f, \ldots, f_{heft}=100$; and N is an order of the Hilbert coefficients used in the Hilbert transformation; such that $H_F$ is the amplitude response at frequency $n\Delta f$.

The coefficients $a_1, \ldots, a_m$ are calculated by a curve fitting method as follows: let $X=[a_1, \ldots, a_m]^T$ and $Y=[H_F(f_{left}=1), \ldots, H_F(f_{heft}=100)]$;

$$A = \begin{bmatrix} \frac{\Delta f}{f_0} & \left(\frac{\Delta f}{f_0}\right)^3 & \ldots & \left(\frac{\Delta f}{f_0}\right)^{2m-1} \\ \frac{2\Delta f}{f_0} & \left(\frac{2\Delta f}{f_0}\right)^3 & \ldots & \left(\frac{2\Delta f}{f_0}\right)^{2m-1} \\ \ldots & \ldots & \ldots & \ldots \\ \frac{100\Delta f}{f_0} & \left(\frac{100\Delta f}{f_0}\right)^3 & \ldots & \left(\frac{100\Delta f}{f_0}\right)^{2m-1} \end{bmatrix}$$

such that the coefficients are calculated by the following formula:

$$X=(A^T A)^{-1} A^T Y$$

According to a second aspect of the invention, a method of determining a measure of the frequency of an electrical signal is provided. The method includes the steps of, based on a plurality of samples of the electrical signal, determining a Hilbert transformation to obtain a value for each of the samples of the electrical signal for use as an imaginary representation of each of the samples of the electrical signal and combine each of said imaginary representation with a corresponding real representation of the samples of the electrical signal to form a complex representation of the electrical signal; performing a Fourier transform on each said complex representation of the samples of the electrical signal and determine a phase angle therefrom; and determining a measure of the frequency of the electrical signal based on a derivative of the phase angle with respect to time.

According to a third aspect we provide a computer program or a computer program product comprising computer program code which, when executed on a processor having memory associated therewith is configured to perform the method of the second aspect.

According to a fourth aspect of the invention we provide a power (distribution) network including the apparatus of the first aspect.

BRIEF DESCRIPTION OF THE DRAWINGS

There now follows, by way of example only, a detailed description of embodiments of the invention with reference to the following figures, in which.

DETAILED DESCRIPTION

Many electrical systems operate using alternating current (AC). While the alternating current may be rated to a particular frequency (the rated frequency), in reality it may vary. It is common for the rated frequency to comprise either 50 Hz or 60 Hz. In some applications the frequency of the electric voltage or current is required to be calculated and tracked. An accurate determination of the frequency may be useful for monitoring of electricity generation system, electricity supply system, electricity distribution system or electrical conversion system or any other type of electrical apparatus/system. Further, the measure of frequency may be used to control other apparatuses or systems, which may perform more efficiently or with improved reliability with an accurate measure of the actual frequency. The example apparatus and method described may provide for accurate, stable and robust calculation of the actual frequency of an input signal (voltage or current) having a rated frequency.

Figure 1:
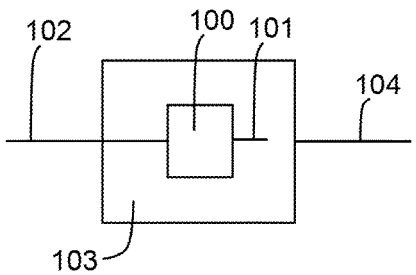
FIG. 1 shows an example apparatus comprising, in this example, a controller for an electrical system.

FIG. 1 shows an apparatus 100 configured to determine a measure 101 of the frequency of an electrical signal 102. The apparatus may form part of an electrical apparatus 103. The electrical apparatus may provide a control signal or monitoring signal 104 based on said measure 101.

Figure 2:
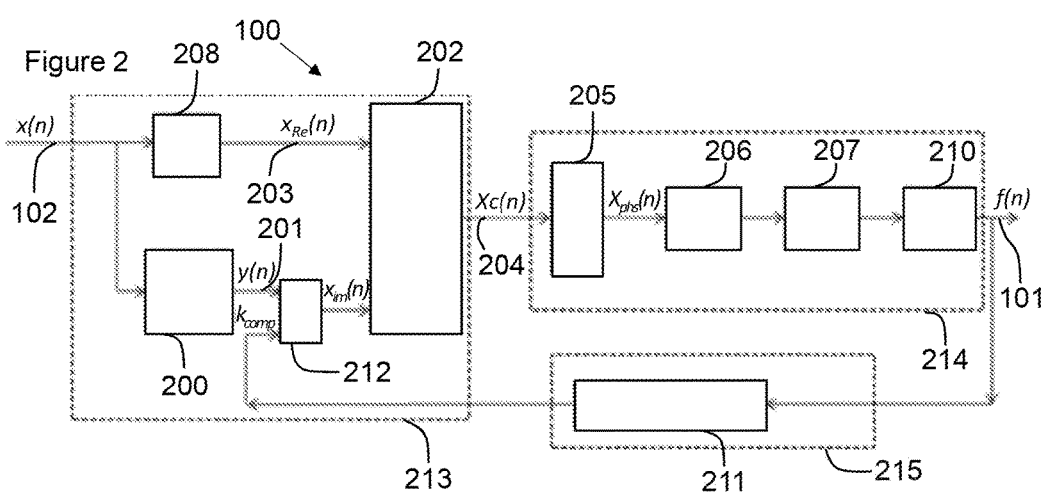
FIG. 2 shows the apparatus of FIG. 1 in more detail.

FIG. 2 shows the functional blocks of the apparatus 100. The functional blocks may or may not represent the form of the apparatus 100 and are intended to diagrammatically show the operations performed by the apparatus 100 in determining the measure of frequency of the electrical signal. The functional blocks may be implemented as one or more discrete processing components or the functionality of one or more of the blocks may be integrated into one functional block. In some examples, a central processor is used to perform the functionality of the blocks shown in FIG. 2.

The apparatus 100 is configured to receive a plurality of samples of the electrical signal at 102. The plurality of samples may comprise voltage or current measurements taken at a predetermined sampling rate, $f_s$. In some examples, the apparatus is configured to operate on a stream of said samples so that the electrical apparatus 103 may be provided with a real time measure of the frequency, such as for use in other control processes. Thus, the apparatus may operate in real time. A block 200 (Hilbert transform block) is provided to determine a Hilbert transformation to obtain an imaginary representation of the electrical signal, shown at 201. A block 202 (complex representation formation block) is configured to combine said imaginary representation 201 with a corresponding (in time) real representation 203 of the samples of the electrical signal to form a complex representation of the electrical signal, shown at 204.

A block 205 (Fourier transform block) is provided and configured to perform a Fourier transform on said complex representation of the electrical signal to determine a phase angle, shown as an output of a block 206 (phase angle block), of the complex representation of the electrical signal. A block 207 (derivative block) is provided to determine a measure of the frequency of the electrical signal based on a derivative of the phase angle with respect to time.

The apparatus 100 shown in FIG. 2 includes several other functional blocks that may be considered optional, such as a delay block 208, an average block 210, a feedback signal block 211 and a feedback combination block 212, which are described in more detail below.

The apparatus 100, in this example, may be considered to comprise three main sections. Firstly, a complex signal formulation block 213 configured to receive the plurality of samples of the electrical signal and, using the Hilbert transformation, and optionally a feedback signal, form a corresponding plurality of complex representations of the electrical signal from the samples. Secondly, a frequency determination block 214 configured to operate on the complex representations of the electrical signal of the block 213 and determine a Fourier transform thereof followed by a derivative of the phase angle. The frequency determination block 214 may be configured to determine an average of a plurality of or a moving window of phase angle derivative values. The average may be taken over a period of the rated frequency or based on the rated frequency. Thirdly, a feedback block 215 configured to determine a feedback signal from the measure of the frequency 101 and provide said feedback signal to modify the imaginary representation of the electrical signal 201. The modification may comprise using the feedback signal as a magnitude compensation coefficient of the imaginary representation of the electrical signal 201. The feedback signal may be determined by using the determined measure of frequency and a curve fitting method to fit to an amplitude-frequency response of coefficients used in the Hilbert transformation.

Looking at the complex signal formulation block 213 in more detail, including the optional blocks, the apparatus receives a plurality of real values that comprise samples of the current or voltage of the electrical signal. To form a complex representation of the electrical signal or, more particularly the samples thereof, the apparatus 100 provides the samples to the Hilbert transform block 200 and to the delay block 208.

The determination of the Hilbert transformation in block 200 to determine the imaginary representation y(n) of the electrical signal x(n), where n represents one of the samples of the electrical signal comprises convolution of electrical signal x(n) samples with Hilbert coefficients in accordance with equation 1:

$$y(n) = x * H(n) = \sum_{k=0}^{2N} x(n-k)H(k) \quad (1)$$

in which symbol "*" represents a convolution operation; and H(k) represents Hilbert coefficients.

The Hilbert coefficients comprise:

$$H(k) = \frac{2}{\pi}\left\{-\frac{1}{N}, \ldots, 0, -\frac{1}{2}, 0, -1, 0, 1, 0, \frac{1}{2}, 0, \frac{1}{3}, 0, \ldots, \frac{1}{N}\right\} \quad (2)$$

The number or order, N, of Hilbert coefficients used may be a compromise between accuracy and computational complexity. In this example, the Hilbert transformation is performed using three Hilbert coefficients. Accordingly, N, the order of the Hilbert coefficients, is chosen as 1 and thus:

$$H(k) = \frac{2}{\pi}\{-1, 0, 1\}$$

In other examples more Hilbert coefficients may be used and thus N may comprise, or comprise less than, or comprise more than 1, 2, 3, 4, 5 or more.

The output of the Hilbert transform block 200 comprises a real number representative of the sample of the electrical signal that is provided as the imaginary part for formulating the complex signal, as described below.

In some examples, the output from the block 200 may be provided directly to the complex representation formation block 202 for use in forming the complex representation of the electrical signal. However, in this example, the output of the Hilbert transformation block 200 is combined with a feedback signal based on the measure of frequency determined by the apparatus 100. It will be appreciated that initially a feedback signal may not be available and a predetermined or default value may be used.

The use of a feedback signal and/or how the feedback signal is determined may be based on the number of Hilbert coefficients used in the Hilbert transformation block 200. For example, if an accurate Hilbert transformation, using more Hilbert coefficients, is determined then a feedback signal may not be required or the effectiveness of the feedback signal need not be as great.

In this example, the imaginary representation is passed to the feedback combination block 212 which multiplies each imaginary representation of the electrical signal samples with the feedback signal, the feedback signal comprising an amplitude compensation coefficient $K_{comp}$, which will be described in more detail below.

Accordingly the feedback combination block 212 generates a feedback-compensated imaginary-representation, $x_{Im}(n)$, of the electrical signal from the samples using the imaginary representation $y(n)$ of the electrical signal and the feedback signal $K_{comp}$ by way of equation:

$$x_{Im}(n) = y(n)/K_{comp} \quad (3)$$

There may be a time delay when the Hilbert transform is taken by the Hilbert transformation block 200. Thus, to ensure that a real representation sample of the electrical signal is combined with a corresponding imaginary representation sample of the electrical signal, a delay may be required. The delay block 208 is configured to delay the samples of the electrical signal 102 such that the complex representation formation block 202 receives real and imaginary values obtained/derived from the same samples of the electrical signal.

The time delay may be based on the number of Hilbert coefficients used in the determination of the Hilbert transformation or the order of the Hilbert coefficients, N, used. As described above, N, in this example is 1.

Accordingly, delay block 208 is configured to receive samples of the electrical signal $x(n)$ and provide a delayed value $x_{Re}(n)$ in accordance with the following formula:

$$x_{Re}(n) = x(n-N) \quad (4)$$

Thus, the delay in terms of the number of samples may be the order of the Hilbert transformation N.

In other examples, the delay block 208 may not be required. For example, the apparatus may receive two streams of samples of the electrical signal, one delayed relative to the other. In other examples the Hilbert transformation may be performed more quickly.

The complex representation formation block 202 receives temporally aligned real representations $x_{Re}(n)$ of the samples of the electrical signal and imaginary representations $x_{Im}(n)$ of the samples of electrical signal. The complex representation formation block 202 determines the complex representation of the electrical signal $x_c(n)$ in accordance with the following equation:

$$x_c(n) = x_{Re}(n) + jx_{Im}(n) \quad (5)$$

where j is the imaginary unit.

The Fourier transform block 205 receives the complex representation of the electrical signal $x_c(n)$ samples and takes the Fourier transform by the following formula:

$$X_{Phs}(n) = \frac{2}{N_{spc}} \sum_{k=0}^{N_{spc}-1} x_c(n-k) \exp\left(j\frac{2\pi k}{N_{spc}}\right) \quad (6)$$

in which $N_{spc}$ comprises the number of samples per cycle of rated fundamental frequency of the electrical signal and k is an index value. For example, if the electrical signal is sampled at a sampling frequency fs of 2000 Hz and the rated fundamental frequency $f_0$ is 50 Hz, then $N_{spc} = f_s/f_0 = 2000/50 = 40$ samples/cycle.

The output of the Fourier transform block 205 comprises a phasor $X_{Phs}(n)$ at instant n.

The phase angle block 206 is configured to determine the phase angle $\varphi(n)$ from the phasor $X_{Phs}(n)$ in accordance with the following equation:

$$\varphi(n) = \arctan\left(\frac{Im(X_{Phs}(n))}{Re(X_{Phs}(n))}\right) \quad (7)$$

where Im( ) represents taking the imaginary part of the phasor $X_{Phs}(n)$ and Re( ) represents taking the real part of the phasor $X_{Phs}(n)$.

The derivative block 207 calculates a derivative of the phase angle $\varphi(n)$. In this example the derivative is determined by the following equation and yields the instantaneous frequency $f_{cal}(n)$:

$$f_{cal}(n) = \frac{\varphi(n) - \varphi(n-1)}{2\pi T_s} \quad (8)$$

where $T_s$ is the sampling period, which is the reciprocal of sampling frequency.

The apparatus 100 may be configured to provide the instantaneous frequency $f_{cal}(n)$ as its output comprising the measure of the frequency of the electrical signal 101.

However, in this example, an average of a plurality instantaneous frequency values $f_{cal}(n)$ is determined and provided as the output comprising the measure of the frequency of the electrical signal 101.

Accordingly, the output f(n) of the apparatus 100 is calculated by the average block 210 which calculates a stable or average output frequency over an averaging window. In particular, the average block may comprise an average filter with window length is $N_{spc}$:

$$f(n) = \frac{1}{N_{spc}} \sum_{k=0}^{N_{spc}-1} f_{cal}(n-k) \quad (9)$$

where $N_{spc}$ comprises the number of samples per cycle of rated fundamental frequency of the electrical signal.

The feedback signal $K_{comp}$ may be calculated, by the feedback signal block 211, from the measure of frequency f(n) provided by the average block 210 in accordance with the following series equation:

$$K_{comp} = a_1 \frac{f}{f_0} + a_2 \left(\frac{f}{f_0}\right)^3 + \ldots + a_m \left(\frac{f}{f_0}\right)^{2m-1} \quad (10)$$

in which $a_1, a_2, \ldots, a_m$ are coefficients calculated by curve fitting to an amplitude-frequency response of coefficients used in the Hilbert transformation and $f_0$ is the rated frequency of the electrical signal.

These coefficients may be obtained by the following steps:

The amplitudes of Hilbert coefficients are calculated with respect to a discrete frequency range from a predetermined lower-expected-frequency-limit $f_{lefl}$ to a predetermined higher-expected-frequency-limit $f_{hefl}$, and using a predetermined frequency step $\Delta f$ in accordance with the following equation:

$$H_F(n) = \left|\sum_{k=0}^{4N-2} H(k)e^{j2\pi k \Delta fn}\right| \quad (11)$$

in which k=$f_{left}$, $f_{left}+\Delta f$, $f_{left}+2\Delta f$, ..., $f_{heft}$; and N is an order of the Hilbert coefficients used in the Hilbert transformation; such that $H_F$ is the amplitude response at frequency $n\Delta f$.

In this example, the following values $f_{left}=1$ and $f_{heft}=100$ will be used as it has been found these values may be generally acceptable for rated frequencies of 50 Hz or 60 Hz.

Thus, as an example, the feedback signal block 211 may be configured to calculate the amplitudes of Hilbert coefficients with respect to the discrete frequency from 1 Hz to 100 Hz using a predetermined frequency step $\Delta f$ of 1 Hz, to realize 100 amplitudes:

$$H_F(n) = \left| \sum_{k=0}^{4N-2} H(k) e^{j2\pi k \Delta f n} \right|$$

where k=1, 2, ..., 100 Hz and N is order of Hilbert coefficient.

The coefficients $a_1, \ldots, a_m$ are calculated by a curve fitting method as follows: Let $X=[a_1, \ldots, a_m]^T$ and $Y=[H_F(1), \ldots, H_F(100)]$, as per the example of $f_{left}=1$ and $f_{heft}=100$:

$$A = \begin{bmatrix} \frac{\Delta f}{f_0} & \left(\frac{\Delta f}{f_0}\right)^3 & \cdots & \left(\frac{\Delta f}{f_0}\right)^{2m-1} \\ \frac{2\Delta f}{f_0} & \left(\frac{2\Delta f}{f_0}\right)^3 & \cdots & \left(\frac{2\Delta f}{f_0}\right)^{2m-1} \\ \cdots & \cdots & \cdots & \cdots \\ \frac{100\Delta f}{f_0} & \left(\frac{100\Delta f}{f_0}\right)^3 & \cdots & \left(\frac{100\Delta f}{f_0}\right)^{2m-1} \end{bmatrix} \quad (12)$$

such that the coefficients are calculated by the following formula:

$$X=(A^T A)^{-1} A^T Y \quad (13)$$

Thus, each row steps through from $f_{left}=1$ to $f_{heft}=100$. As mentioned above, the predetermined lower-expected-frequency-limit $f_{left}$ may comprise 1 Hz and the predetermined higher-expected-frequency-limit $f_{heft}$ may comprise 100 Hz. It will be appreciated that other values may be used and the limits may relate to an expected range of variation from the rated frequency. Thus, the equations above could be generalized accordingly.

In this example the series of equation 10 is truncated such that $K_{comp}$ is provided by the following equation:

$$K_{comp} = a_1 \frac{f}{f_0} + a_2 \left(\frac{f}{f_0}\right)^3 \quad (14)$$

It will be appreciated that the series may be truncated at (or less than/more than) 1, 2, 3, 4, 5, 6, 7, 8 or more terms.

Thus, given that in the example above the order of the Hilbert transformation is N=1, then the coefficient of a1 and a2 can be calculated as:

$a_1=0.1$;

$a_2=-1.0281E-04$.

Accordingly, $K_{comp}$ is a real value that may be used to modify the magnitude of the imaginary representation to compensate for any inaccuracy in the determination of the Hilbert transformation due to the order selected therefore, as described above.

It has been found that the apparatus may provide a measure of the frequency of the electrical signal that is accurate to less than $1 \times 10^{-7}$ Hz. Further, the stability and robustness of the frequency determination may be surprisingly advantageous such that for 1% white noise in the electrical signal the error in the measure of frequency may be less than 0.05 Hz.

Figure 3:
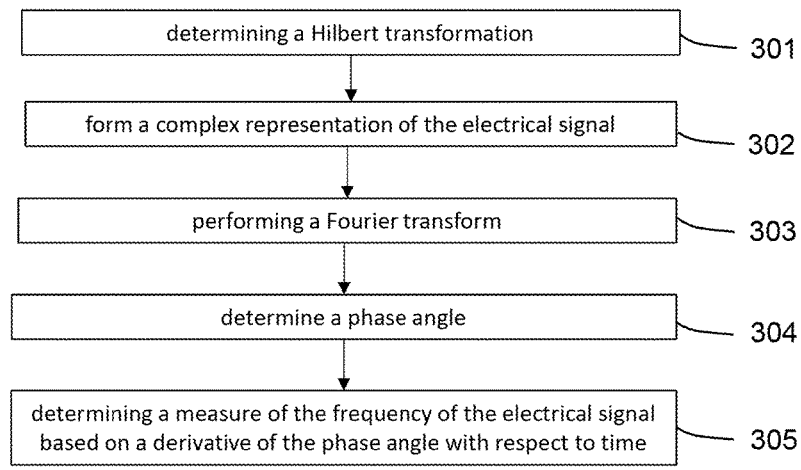
FIG. 3 shows a flow chart illustrating an example method.

FIG. 3 shows a flow chart illustrating the steps of the method of determining a measure of the frequency of the electrical signal performed by the apparatus 100. The flow chart shows; determining 301 a Hilbert transformation of each of the samples of the voltage or current of the electrical signal to obtain an imaginary representation thereof; forming 302 a complex representation of each of the samples of the electrical signal; performing 303 a Fourier transform to obtain a phasor; determining 304 a phase angle from the phasor; determining 305 a measure of the frequency of the electrical signal based on a derivative of the phase angle with respect to time.

It is to be understood that even though numerous characteristics and advantages of various embodiments have been set forth in the foregoing description, together with details of the structure and functions of various embodiments, this disclosure is illustrative only, and changes may be made in detail, especially in matters of structure and arrangement of parts within the principles of the embodiments to the full extent indicated by the broad general meaning of the terms in which the appended claims are expressed. It will be appreciated by those skilled in the art that the teachings disclosed herein can be applied to other systems without departing from the scope and spirit of the application.

What is claimed is:

1. An apparatus for determining a measure of the frequency of an electrical signal, the apparatus configured to:
   receive, by a controller for an electrical system, one or more samples of the electrical signal;
   determine, based on the one or more samples of the electrical signal, a Hilbert transformation to obtain a value for each of the samples of the electrical signal for use as an imaginary representation of each of the samples of the electrical signal and combine each said imaginary representation with a corresponding real representation of the samples of the electrical signal to form a complex representation of the electrical signal;
   perform a Fourier transform on each of said complex representation of the samples of the electrical signal and determine a phase angle therefrom;
   determine a measure of the frequency of the electrical signal based on a derivative of the phase angle with respect to time;
   provide a feedback signal $K_{comp}$ based on the determined measure of the frequency; and
   modify a magnitude of said imaginary representation of the samples of the electrical signal by said feedback signal prior to said Fourier transformation.

2. An apparatus according to claim 1, wherein the apparatus is further configured to provide said measure of the frequency of the electrical signal to the controller, wherein the controller uses the measure of frequency for control of the electrical system.

3. An apparatus according to claim 1, wherein determination of the measure of the frequency is based on an average of the derivative of the phase angle with respect to time.

4. An apparatus according to claim 1, wherein the apparatus is configured to time delay the real representation of the measurement of the electrical signal to temporally align it with the imaginary representation when forming the complex representation of the electrical signal, said time delay based on an order of Hilbert coefficients used in the determination of the Hilbert transformation.

5. An apparatus according to claim 1, wherein the determination of the Hilbert transformation to determine the imaginary representation y(n) of the electrical signal x(n), where n is one of the samples of the electrical signal, comprises convolution of electrical signal x(n) with Hilbert coefficients in accordance with the following formula:

$$y(n) = x * H(n) = \sum_{k=0}^{2N} x(n-k)H(k)$$

in which symbol "*" represents a convolution operation; and H(k) represents Hilbert coefficients as follows:

$$H(k) = \frac{2}{\pi}\left\{-\frac{1}{N}, \ldots, 0, -\frac{1}{2}, 0, -1, 0, 1, 0, \frac{1}{2}, 0, \frac{1}{3}, 0, \ldots, \frac{1}{N}\right\}$$

where N represents an order of the Hilbert coefficients.

6. An apparatus according to claim 5, wherein the Hilbert transformation is performed using three Hilbert coefficients.

7. An apparatus according to claim 1, wherein the following equation is calculated to determine the phase angle $\varphi(n)$ from a phasor $X_{Phs}(n)$, said phasor comprising the output of the Fourier transform:

$$\varphi(n) = \arctan\left(\frac{\operatorname{Im}(X_{Phs}(n))}{\operatorname{Re}(X_{Phs}(n))}\right).$$

8. An apparatus according to claim 7, wherein the measure of frequency comprises an instantaneous measure of frequency $f_{cal}(n)$ and is determined by the following equation:

$$f_{cal}(n) = \frac{\varphi(n) - \varphi(n-1)}{2\pi T_s}$$

in which n is the sample number of the plurality of samples and $T_s$ is the sampling period.

9. An apparatus according to claim 7, wherein the measure of frequency comprises an average measure of frequency f(n) and is determined by the following average filter formula:

$$f(n) = \frac{1}{N_{spc}} \sum_{k=0}^{N_{spc}-1} f_{cal}(n-k)$$

in which the window length $N_{spc}$ of the average filter comprises the number of samples per cycle of rated fundamental frequency of the electrical signal and k is an index value and;

$$f_{cal}(n) = \frac{\varphi(n) - \varphi(n-1)}{2\pi T_s}$$

in which $\varphi(n)$ is the phase angle of sample n, n is the sample number of the plurality of samples and $T_s$ is the sampling period.

10. An apparatus according to claim 1, wherein the feedback signal $K_{comp}$ is based on a curve fitting method to an amplitude-frequency response of Hilbert coefficients used in the Hilbert transformation.

11. An apparatus according to claim 10, wherein the feedback signal $K_{comp}$ is determined by the following formula:

$$K_{comp} = a_1 \frac{f}{f_0} + a_2 \left(\frac{f}{f_0}\right)^3 + \ldots + a_m \left(\frac{f}{f_0}\right)^{2m-1}$$

in which $a_1, a_2, \ldots,$ am are coefficients calculated by curve fitting to an amplitude-frequency response of coefficients used in the Hilbert transformation and $f_0$ is a rated frequency of the electrical signal.

12. A power network including the apparatus of claim 1.

13. A method of determining a measure of the frequency of an electrical signal comprising:
 receiving, by a controller for an electrical system, one or more samples of the electrical signal;
 determining, based on the one or more samples of the electrical signal, a Hilbert transformation to obtain a value for each of the samples of the electrical signal for use as an imaginary representation of each of the samples of the electrical signal and combine each said imaginary representation with a corresponding real representation of the samples of the electrical signal to form a complex representation of the electrical signal;
 performing a Fourier transform on each of said complex representation of the samples of the electrical signal and determine a phase angle therefrom;
 determining a measure of the frequency of the electrical signal based on a derivative of the phase angle with respect to time;
 providing a feedback signal $K_{comp}$ based on the determined measure of the frequency; and
 modifying a magnitude of said imaginary representation of the samples of the electrical signal by said feedback signal prior to said Fourier transformation.

14. A non-transitory computer-readable medium storing computer-executable instructions, that when executed by at least one processor, cause at least one processor to:
 receive, by a controller for an electrical system, one or more samples of the electrical signal;
 determine, based on the one or more samples of the electrical signal, a Hilbert transformation to obtain a value for each of the samples of the electrical signal for use as an imaginary representation of each of the samples of the electrical signal and combine each said imaginary representation with a corresponding real representation of the samples of the electrical signal to form a complex representation of the electrical signal;
 perform a Fourier transform on each of said complex representation of the samples of the electrical signal and determine a phase angle therefrom;
 determine a measure of the frequency of the electrical signal based on a derivative of the phase angle with respect to time;

provide a feedback signal $K_{comp}$ based on the determined measure of the frequency $K_{comp}$; and modify a magnitude of said imaginary representation of the samples of the electrical signal by said feedback signal prior to said Fourier transformation.

\* \* \* \* \*